(12) United States Patent
Knorr et al.

(10) Patent No.: US 8,153,702 B2
(45) Date of Patent: Apr. 10, 2012

(54) METHOD OF PRODUCING AN ELECTRET MATERIAL

(75) Inventors: Nikolaus Knorr, Stuttgart (DE); Silvia Rosselli, Mannheim (DE); Tzenka Miteva, Stuttgart (DE); Gabriele Nelles, Stuttgart (DE)

(73) Assignee: Sony Corporation, Tokyo (JP)

( * ) Notice: Subject to any disclaimer, the term of this patent is extended or adjusted under 35 U.S.C. 154(b) by 228 days.

(21) Appl. No.: 12/559,135

(22) Filed: Sep. 14, 2009

(65) Prior Publication Data

US 2010/0222533 A1    Sep. 2, 2010

(30) Foreign Application Priority Data

Dec. 8, 2008  (EP) ..................................... 08021307

(51) Int. Cl.
*C08F 2/42* (2006.01)
*B29C 65/14* (2006.01)
*H05B 6/00* (2006.01)

(52) U.S. Cl. .............. 522/86; 522/71; 522/84; 522/150; 522/152; 522/153; 522/155; 522/156; 522/157; 522/160; 264/405; 264/435; 264/436

(58) Field of Classification Search .............. 522/71, 522/83, 84, 86, 150, 151, 152, 153, 154, 522/155, 157, 160; 264/405, 435, 436
See application file for complete search history.

(56) References Cited

U.S. PATENT DOCUMENTS

| | | | |
|---|---|---|---|
| 3,702,493 A | 11/1972 | Murphy | |
| 4,340,953 A | 7/1982 | Iwamura et al. | |
| 5,132,934 A | 7/1992 | Quate et al. | |
| 5,280,406 A | 1/1994 | Coufal et al. | |
| 5,724,336 A | 3/1998 | Morton | |
| 6,489,033 B1 | 12/2002 | Hatke et al. | |
| 7,232,771 B2 | 6/2007 | Jacobs et al. | |
| 2005/0107555 A1 | 5/2005 | Chiang et al. | |

FOREIGN PATENT DOCUMENTS

| | | |
|---|---|---|
| CN | 101071683 A | 11/2007 |
| EP | 0 066 878 A2 | 12/1982 |
| GB | 2 136 207 A | 9/1984 |
| JP | 6-264361 | 9/1994 |
| JP | 2003-64578 | 3/2003 |
| JP | 2005-151026 | 6/2005 |
| JP | 2006-291045 | 10/2006 |
| WO | WO 01/80257 A1 | 10/2001 |

OTHER PUBLICATIONS

Office Action issued Feb. 11, 2011, in Chinese Patent Application No. 200910261498.6 with English translation.

*Primary Examiner* — Sanza McClendon
(74) *Attorney, Agent, or Firm* — Oblon, Spivak, McClelland, Maier & Neustadt, L.L.P.

(57) ABSTRACT

The present invention relates to a method of producing an electret material, to a new class of electret materials and to a device comprising such electret materials.

29 Claims, 3 Drawing Sheets

METHOD OF PRODUCING AN ELECTRET MATERIAL

The present invention relates to a method of producing an electret material, to a new class of electret materials and to a device comprising such electret materials.

Electret materials are generally dielectric materials which have a quasi-permanent electrical charge or dipole polarization. An electret generates internal and external electric fields and is the electrostatic equivalent of a permanent magnet. The term "electret" was coined by Oliver Heaviside in 1885 but materials having electret properties had already been studied since the early 18$^{th}$ century. Generally speaking there are two types of electrets, namely real-charge electrets which contain excess charge of one or both polarities either on the surface of the dielectric, in which case there is a surface charge, or within the volume of the dielectric, in which case there is a space charge. Secondly, there are oriented dipole electrets which contain oriented dipoles. An example of these oriented dipole electrets are ferroelectric materials. Electret materials occurring in nature are for example quartz and various forms of silicon dioxide. Most commercially used electrets are made from synthetic polymers.

1. Electret Materials:

Most commercially produced polymer electrets are based on fluoropolymers (e. g. amorphous poly(tetrafluoroethene) (PTFE, Teflon®)), fluorinated ethylene-propylene) (FEP), or polyvinylidene fluoride (PVDF)) machined to thin films. They have the advantage of very long retention times of the stored charge. Other polymers used are e.g. polypropylene, poly(methyl methacrylate) (PMMA), polycarbonates (PC), polystyrene (PS), polyethylene terephthalate (PET), polyamides (Nylons), and polyimides, which have the advantage that they can be cast from solution to form thin films on many types of surfaces and shapes. Real-charge electrets contain either positive or negative excess space or surface charges or both, while oriented-dipole electrets contain oriented dipoles. The quasi-permanent internal or external electric fields created by electrets can be exploited in various applications.

Modern electret materials can have charge densities of up to $10^{15}$ elementary charges per $cm^3$ with retention times longer than ten years.

2. Methods of Charging:

Bulk electrets are commonly prepared by cooling a suitable dielectric material within a strong electric field after heating it above some characteristic temperature like the glass transition temperature for polymers or its melting temperature. The electret is typically made in the form of a thin film with two electrodes either evaporated or pressed onto the film or one or both electrodes held in a short distance to the film. The high field repositions the charge carriers, or aligns the dipoles within the material, or deposits or injects external charge carriers from or at to the electrodes. When the material cools, solidification freezes them in position.

Electrets are also frequently manufactured by embedding excess charge within a dielectric by stranding charges on, or near, the surface using high voltage corona discharges, a process called corona charging, or by using an electron or ion beam. Corona charging is frequently done by a triode setup with a planar back electrode underneath the dielectric film, a grid electrode above the film and a pointed electrode above the grid at a high potential. The grid electrode makes the charging more homogeneous and allows for higher potentials.

Another way of charging electrets is by contact electrification, also referred to as triboelectric charging, where the material to be charged is brought in mechanical contact to another different or the same material and is then separated again such as through rubbing or through particles rolling in a drum.

3. Applications:

Electret materials have found commercial and technical interest. Their applications can be grouped into two groups, one group where the electret material is charged once during production and the other group where the electret material is repeatedly recharged and erased during operation of the device.

Applications belonging to the first group are e.g. electret microphones which are widely used in mobile phones, headphones, loudspeakers, and electromechanical transducers, piezoelectric electrets, electret motors and generators, electret air filters for dust particle control, electret ion chambers for measuring ionizing radiation or radon, polymer electret materials for nonlinear optics, and electret foils and bandages for improved wound and fractured bone healing and blood compatibility.

Applications belonging to the second group are electret materials used in Xerography, laser printers, and recently in NanoXerography (U.S. Pat. No. 7,232,771), and data storage (e.g. U.S. Pat. Nos. 4,340,953, 5,132,934, 5,724,336).

Disadvantages associated with current methods of producing electret material are that high voltages above 1000 V need to be applied to the charging electrode. Moreover, with many currently available charging methods, electret materials are only charged close to the surface but not in the bulk material, and the charging is prone to inhomogeneities. If the electret materials are used in data storage applications, their repeated charging only has a low resolution and data density. Moreover, electret materials currently available are typically insoluble in water and therefore not amenable to processing steps involving the use of water.

Accordingly it was an object of the present invention to provide for an improved method of producing electret materials. Another object of the invention was to provide electret materials which can be strongly and homogeneously charged and easily manipulated, for example handled as films.

The objects of the present invention are solved by a method of producing an electret material comprising the steps:
a) providing a polymeric dielectric material,
b) electrically charging said polymeric dielectric material, whilst maintaining relative humidity conditions around said material at a relative humidity within a user-defined range, wherein charging occurs by a method selected from (i) heating said polymeric dielectric material to a temperature above the melting temperature or glass transition temperature of said material, subjecting said material to an electric field and cooling said material in the presence of said electric field to a temperature below said melting temperature or glass transition temperature, (ii) corona charging, (iii) subjecting said material to an electron beam or ion beam, (iv) contact electrification, and (v) combinations of any of the foregoing.

In one embodiment said polymeric dielectric material is amorphous.

In one embodiment said polymeric dielectric material is a hydrophobic polymer having a water uptake<0.1 wt. %, such as poly(tetrafluoroethene), wherein said relative humidity conditions of step b) are maintained at <5%, preferably <1%, or said polymeric dielectric material is a water-insoluble polymer having a water uptake in the range of from 0.1 wt. % to 3 wt. %, such as poly(methyl methacrylate), wherein said relative humidity conditions of step b) are maintained at a range of from 20% to 40%, or wherein said polymeric dielectric material is a water-soluble or hydrophilic or polyelectrolytic polymer having a water uptake>3 wt. %, such as polyacrylamide, wherein said relative humidity conditions of step b) are maintained at <5%, preferably <1%.

In one embodiment said hydrophobic polymer has a contact angle>100%.

In one embodiment said hydrophobic polymer is selected from the group comprising poly(tetrafluoroethene), fluorinated ethylene-propylene, polyvinylidene fluoride, polystyrene, cyclic olefin copolymer.

In one embodiment said water-insoluble polymer is selected from the group comprising poly(methyl methacrylate), polycarbonate, polyvinyl chloride, polyamide.

In embodiment said water-soluble or hydrophilic or polyelectrolytic polymer is selected from the group comprising poly(acrylamide), poly(acrylic acid), polyethyleneimine, polyvinylamine, poly(ethylene glycol), polyvinyl acetate, poly(2-hydroxyethyl methacrylate), poly (dimethylaminoethyl methacrylate), poly(vinylimidazole), poly(2-methyl-2-oxazoline), poly(2-ethyl-2-oxazoline), poly(N-isopropylacrylamide), poly(dimethylaminoethyl methacrylate).

In one embodiment said relative humidity conditions of step b) are maintained at <1%, and wherein said polymeric dielectric material is dried prior to performing step b), preferably dried by heating in vacuum or dry controlled atmosphere or by storage under dry conditions for a sufficient time to dehydrate said polymeric dielectric material to a water content <0.1 wt. %.

In one embodiment said polymeric dielectric material is prepared as a film, preferably a thin film cast from aqueous solution.

In one embodiment said polymeric dielectric material, after performing step b), is maintained under the same relative humidity conditions as in step b), preferably by sealing or coating or storing said polymeric dielectric material, and using said polymeric dielectric material at the same relative humidity conditions as in step b).

In one embodiment charging occurs by corona charging using a plane electrode on one side of said polymeric dielectric material and at least one pointed electrode or an elongated electrode or a wire-shaped electrode, on another side of said polymeric dielectric material which said pointed or elongated or wire-shaped electrode is at a potential of 1 V to 100 kV, preferably a potential in the range from 1 V to <1 kV, more preferably in the range from 1 V to 0.5 kV, and most preferably in the range from 1 V to 100 V, with respect to said plane electrode, and, optionally, a grid-shaped electrode between said polymeric dielectric material and said pointed or elongated or wire-shaped electrode.

In one embodiment said pointed or elongated or wire-shaped electrode is in contact with said polymeric dielectric material and said grid-shaped electrode is absent The objects of the present invention are also solved by an electret material being made of a water-soluble or hydrophilic or polyelectrolytic polymer.

In one embodiment said polymer is selected from polyacrylamide, poly(acrylic acid), polyethylenimine, polyvinylamine, poly(ethylene glycol), polyvinylacetate, poly(-hydroxyethyl methacrylate), poly (dimethylaminoethyl methacrylate), poly(vinylimidazole), poly(2-methyl-2-oxazoline), poly(2-ethyl-2-oxazoline), poly(N-isopropylacrylamide), poly(dimethylaminoethyl methacrylate).

In one embodiment the electret material according to the present invention is produced by the method according to the present invention.

In one embodiment the electret material according to the present invention has a water content<0.1 wt. % prior to performing step b).

The objects of the present invention are also solved by a device comprising the electret material according to the present invention.

In one embodiment the device is an electronic device.

In one embodiment the device is selected from microphones, mobile phones, loudspeakers, electromechanical transducers, piezoelectric electrets, electret motors and generators, electret air filters for dusk particle control, electret ion chambers for detecting ionizing radiation or radon, devices comprising nonlinear optics or nanofluidics, electret fields effect transistors for data storage, foils and bandages for wound and fractured bone healing, laser printers and xerographic devices.

The term "producing an electret material", as used herein, is meant to refer to a process wherein, effectively, a dielectric material is electrically charged. The term "relative humidity conditions around said material" is meant to refer to those relative humidity conditions to which a material is subjected and exposed. This may for example be the relative humidity conditions within a compartment in which the material is present. The term "corona charging" is meant to refer to a process whereby a material is electrically charged through the application of high electric fields and a discharge occurs between one of the electrodes at high potential and the dielectric material. The charging may be mediated by a field condensed water film at the biased electrode. The term is also meant to include the state before a corona discharge occurs but where the electric field has already been applied. Typical electrical fields which are used for corona charging in accordance with the present invention are in the range of from 1 V to 100 kV.

In preferred embodiments of the method according to the present invention, corona charging is performed with electrical fields in the range of from 1 V to <1 kV, preferably in the range from 1 V to 0.5 kV, more preferably in the range from 1 V to 100 V, the voltages indicating the potential of the pointed or elongated or wire-shaped electrode with respect to the other electrode, preferably the plane electrode. It should be noted that, in accordance with the present invention, considerably lower electrical fields may be used in comparison to those electrical fields which are normally applied for corona charging according to the art.

The term "contact electrification", as used herein is meant to refer to a process, wherein the dielectric material that is to be electrically charged is brought in mechanical contact to another material which may be of a different or the same type of material, and is then separated therefrom again. The simplest example for such contact electrification is rubbing, for example a plastic balloon being rubbed with a woolen cloth. Other examples are the motions of particles in a revolving drum. The term "contact electrification", is also sometimes referred to as "triboelectric charging". The term "relative humidity", as used herein, is meant to refer to the ratio of the amount of water vapor in the air/atmosphere at a given temperature to the maximum amount of water vapor that the air/atmosphere could hold at the same temperature. The relative humidity is given as a percentage value and therefore ranges from 0% (complete dryness) to 100% (saturation with water vapor). "Relative humidity conditions around said material" refer to the relative humidity conditions to which said material is exposed.

The term "amorphous polymeric dielectric material" as used herein, is meant to refer to a polymeric dielectric material which is non-crystalline or semicrystalline with a crystallinity below 10%. The method according to the present invention works with "amorphous polymeric dielectric materials" in the aforementioned sense.

A "crystallinity<10%", as used herein with reference to a material, is meant to signify that less than 10% of the volume or the weight of said material has a crystalline order. The term "a polymer which is water-soluble or hydrophilic or polyelectrolytic" as used herein, is meant to refer to a polymer which has one or more of the foregoing qualities. Hence, the three terms "water-soluble", "hydrophilic", and "polyelectrolytic" are not meant to be mutually exclusive alternatives, but rather, they may also be applicable in combinations. For example, a polymer may be hydrophilic and water-soluble, or it may be water-soluble and hydrophilic and polyelectrolytic.

The term "water uptake" as used herein, refers to the maximum amount of water that can be absorbed by the polymeric dielectric material with reference to the weight of the polymeric dielectric material. Numbers given are the weight of absorbable water with reference to the weight of the polymeric dielectric material for a specimen of polymeric dielectric material exposed to a 50% relative humidity (RH) for 24 hours at 23° C.

It should also be noted that the term "having a water uptake>3 wt. % does not exclude further qualities, such as "water-soluble", "hydrophilic" or "polyelectrolytic". Rather, and as an example, a polymer may be hydrophilic and water-soluble and have a water uptake>3 wt. %, or a polymer may be water-soluble and hydrophilic and polyelectrolytic and have a water uptake>3 wt. %.

The term "water content", as used herein, is meant to refer to the amount of water contained by the polymeric dielectric material. The numbers given are percentages, i.e. the weight of contained water with reference to the weight of the polymeric dielectric material containing such water.

It should also be noted that the term "water uptake", as used herein, refers to the capability of the polymeric dielectric material to take up water. A polymeric dielectric material having a water uptake>3wt. %, as an example, is a polymeric dielectric material which is capable of taking up >3 wt. % water. In contrast thereto "water content" refers to the amount of water actually contained in the material.

As an example, for the water-soluble or hydrophilic or polyelectrolytic polymer in accordance with the present invention to have a water uptake>3 wt. %, such water-soluble or hydrophilic or electrolytic polymer is preferably dried prior to performing step b) so as to dehydrate the polymeric dielectric material, in this example case to a water content<0.1 wt. %. It should also be noted that the term" water content", as used herein, refers to the actual amount of water contained in or by said polymeric dielectric material, with reference to the weight of the polymeric dielectric material.

The invention is based on the observation that electret materials can be more strongly and deeper charged if the appropriate amount of ambient humidity is present during charging. In corona charging, the humidity also has an influence on the homogeneity of the deposited charge. For example, water absorbing but insoluble polymers like PMMA and PC are more strongly corona charged, if a humidity of about 30% RH (relative humidity) is present during charging.

The invention also introduces a new group of hydrophilic polymers which are water soluble or have a high uptake of water in humid environment like e.g. polyacrylamide (PAAm), which can be strongly charged by corona charging in low ambient humidity (e.g. RH<5%, depending on the material and the corona charging voltage) preferably when thoroughly dehydrated before charging, more preferably to a water content<0.1 wt. %.

New Space Charge Electret Material Group in Accordance with the Present Invention Polymers being amorphous, i.e. non-crystalline or semicrystalline (crystallinity below 10%) and having one or more of the following characteristics: water soluble, water uptake>3 wt. percent), hydrophilic, or polyelectrolytic.

For example: Polyacrylamide (PAAm), Poly(acrylic acid) (PAAc), Polyethylenimine (PEI), Polyvinylamine, Poly(ethylene glycol) (PEG), Polyvinyl acetate (PVA), poly(2-hydroxyethyl methacrylate), poly (dimethylaminoethyl methacrylate), poly(vinylimidazole), poly(2-methyl-2-oxazoline), poly(2-ethyl-2-oxazoline), poly(N-isopropylacrylamide), poly(dimethylaminoethyl methacrylate)).

Also copolymers, with one of the components from the group mentioned above, belong to the group.

These polymers can be charged by the method described below in dry conditions, preferably at a relative humidity<5%, more preferably <1%. Before charging, these polymer materials, in the form of e.g. a thin film made by spin casting from water solution, are thoroughly dried by heating in vacuum or dry atmosphere for sufficient time to remove water absorbed in the material, preferably to a water-content<0.1 wt. %, and subsequently stored in very dry conditions until charging.

Because absorbed water may reduce the charge retention and because the hydrophilic or water-soluble or polyelectrolytic polymers described here are water absorbing, sealing after charging by a coating, e.g. a hydrophilic polymer film cast from solution onto the film or coating by evaporation of water blocking material is recommended, or the material should be stored and operated in dry conditions.

New Modified Method for Charging of Electret Materials (Including all Types of Known Electret Material, Organic or Inorganic)

In accordance with embodiments of the present invention, the humidity during charging is controlled individually for the used material to increase the strength, depth and homogeneity of the deposited charge and to reduce the required charging voltages. Without wishing to be bound by any theory, the idea behind this is that the charging is due to water ions which are formed from water present in the ambient air or in the polymer and attracted to the high electric fields applied during charging. The water ions are then injected into the electret material by the high electric fields.

The humidity has to be controlled individually for the different materials and to the applied fields and geometry of the charging setup, because water also reduces the amount of stored charge by screening the high electric fields at the electrode and by increasing the surface and bulk ionic conductivity, i.e. increasing the discharging of the stored charge.

The humidity is especially important in corona charging, because of the free access of the ambient water to the high field at the pointed electrode.

Corona charging of electret material, is typically done with a plane or roller back electrode underneath the dielectric film on one side and a single or an arrangement of pointed, or knife-like, or wire shaped, or flat but small electrodes at high voltage relative to the back electrode in contact to or close to the electret material on the other side. Frequently, a third grid electrode is used in between the two other electrodes, making the charging more homogeneous and allowing for higher potentials. This third electrode can not be used if the electrode at high potential is in direct contact to the electret material.

It should be noted that the pointed electrode or elongated electrode or wire-shaped electrode in accordance with the present invention has a surface of curvature, with the curvature being sufficient for the formation of an electric field in the range of from 1 V to 100 kV, preferably in the range from 1 V to <1 kV, more preferably in the range form 1 V to 0.5 kV, and most preferably in the range from 1 V to 100 V. This can for example be achieved by an electrode having a sharp tip or a sharp edge or being a thin wire. In some embodiments, such surface forms a cone having a cone angle of ≦120%, preferably ≦90°, and more preferably ≦45°. In some embodiments, especially in AFM-applications, the electrode has a curvature having a curvature radius in the range of from 30 nm to 5 mm, preferably 30 nm to 1 mm, more preferably 30 nm to 100 μm, and even more preferably 30 nm to 1 μm.

The term "corona charging" usually refers to charging by high electric fields when a corona discharge is ignited at the pointed electrode of high potential. Here, this term "corona charging" also refers to fields below 1 kV being applied before corona discharge occurs. In some embodiments of the method according to the present invention, charging occurs by corona charging using a plane electrode on one side of said polymeric dielectric material and at least one pointed electrode or an elongated electrode or a wire-shaped electrode on another side of said polymeric dielectric material which said pointed or elongated or wire-shaped electrode is at a potential in the range of from 10 V to 90 V, preferably 20 V to 80 V, with respect to said plane electrode. The pointed or elongated or wire-shaped electrode has a surface of curvature which is sufficient to achieve any of the aforementioned electrical fields necessary for performing step b). Preferably and for practical purpose, such electrode has a sharp tip or a knife-like edge. When larger areas of electret material are to be charged, an array of pointed or elongated or wire-shaped electrodes may also be used.

The charging by water ions described here is especially effective if the elongated or pointed or wire-shaped electrode is in direct contact with the material so that a microscopic water bridge is formed when the electric fields are applied. A direct contact also strongly reduces the required charging voltage. The direct mechanical contact should be force controlled so that the pointed or elongated or wire-shaped electrodes do not damage the electret material.

For example, for poly(acrylic acid), the relative humidity conditions during charging have to be low (preferably <1% RH), (RH=relative humidity), because too much water present in the film will increase the bulk ionic conductivity discharging material. For hydrophobic polymers like e.g. poly(tetrafluoroethene), the relative humidity conditions during charging have to be low (<1% RH), because higher humidity strongly increases the ionic surface conductivity, also discharging the stored charge. For e.g. poly(methyl methacrylate), corona charging is more efficient at higher relative humidity conditions (~30% RH).

The following table summarizes the three groups of polymeric dielectric materials in accordance with the present invention and shows their respective water uptake capability (second column), the humidity conditions preferred during charging (third column), and the humidity conditions preferred during the application of the respective dielectric polymeric material.

As used in this table, the term "low humidity" refers to a relative humidity (RH)<5%, preferably <1%. The term "mid humidity", as used in this table, refers to a relative humidity in the range of from 20% to 40%.

It should be noted that with respect to the water-insoluble polymeric dielectric materials, these may be used in two different setups: Either they are charged once during production (application group 1), or they are repeatedly recharged and erased during operation of the respective device in which such electret material is incorporated. Examples of the first application group are electret microphones, electromechanical transducers, electret motors etc., as outlined further above. Examples of the second application group are electret materials used in xerography, laser printers and data storage. In this second group of applications, a higher resolution is achieved by maintaining and applying a relative humidity<5%.

TABLE 1

| Polymeric dielectric material | Water uptake | Humidity conditions during charging | Humidity conditions during application |
|---|---|---|---|
| Hydrophobic (e.g. COC, PS) | Very low (<0.1 wt %) | All with low humidity because of surface conduction discharge (RH < 5%, preferably <1%) | All at low humidity (RH < 5%) |
| Water-insoluble (e.g. PMMA, PC) | Low (from 0.1 wt % to 3 wt %) | All with mid humidity (20% ≦ RH ≦ 40%) | Application group 1: mid humidity (20% < RH < 40%) Application group 2: low humidity for higher resolution (<5%) |
| Water-soluble/ hydrophobic/ polyelectrolytic (e.g. PAAm, PAAc) | High (>3 wt %) | All with low humidity because of bulk conduction discharge (RH < 5%, preferably <1%) | All at low humidity (RH < 5%) |

Before charging, all materials should be thoroughly dehydrated, preferably to a water content<0.1 wt. %, by heating and stored under dry atmosphere.

This method may be combined with any other method of charging electrets, e.g. cooling of the material from a higher temperature during charging, or using a third grid electrode to increase the homogeneity of the deposited charge.

After charging, the material might be sealed with a film of a hydrophobic material to improve the charge retention and avoid water absorption (for applications where no recharging is needed).

The present invention provides for a new class of electret materials which are water-soluble and which can therefore be processed in steps involving water. Moreover, the new class of water-soluble/hydrophilic/polyelectrolytic polymer can be strongly charged with space charges having a higher penetration into the bulk. Moreover, the new method of producing an electret material allows lower charging voltages down to a few volts (this can be seen from the onset of charging for polyacrylamide in FIG. 3) as compared to voltages far in excess of 1000 V usually used in electret charging. and it allows for increased homogeneity, increased strength and higher depth of charging. Moreover, the resolution and data density of xerography and storage applications based on the method according to the present invention can be increased by operating in low humidity.

Moreover, reference is made to the figures, wherein

Moreover, reference is made to the following example which is given to illustrate, not to limit the present invention.

EXAMPLE

Figure 1:
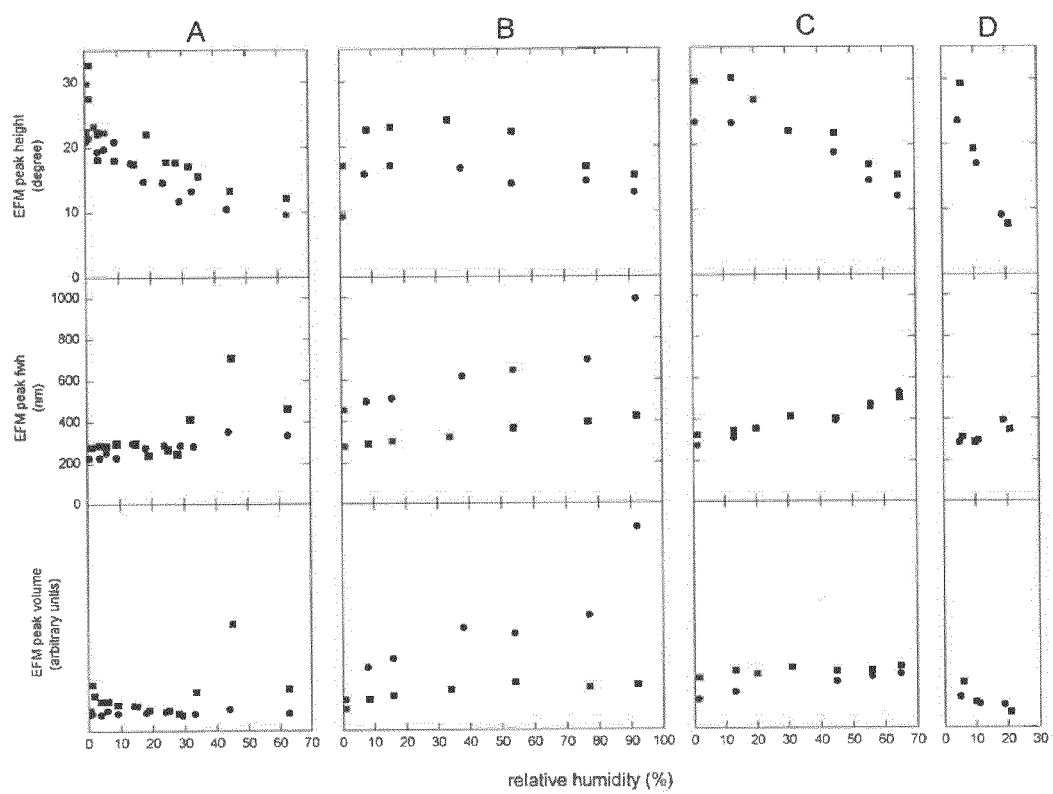
FIG. 1 shows peak height, width and volume of electric force microscopy phase scans of charge spots written in varied relative humidity for various polymers (COC=cyclic olefin copolymer; PMMA=polymethyl methacrylate, PAAm=polyacrylamide, and PAAc=polyacrylic acid)

FIG. 1 gives peak height, width, and volume of electric force microscopy phase scans of charge spots written in varied humidity on (A) COC (cyclic olefin copolymer, TOPAS®6015), (B) PMMA, (C) PAAm, and (D) PAAc thin film (~500 nm thickness) samples. The samples were made by spin casting the polymers from solution onto platinum electrodes on glass substrates and subsequent heating in a $N_2$ glove box with a relative humidity below 0.1% to 150° C. for one hour. The spots are written by voltage pulse application to a conducting atomic force microscopy (AFM) tip (platinum covered "ElectriTap300" AFM probes from Budget Sensors®) in contact to the polymer. The EFM phase scans have been recorded with a tip oscillation at resonance frequency (~270000 Hz) of about 10 nm at 20 nm lift height. The black squares and red discs in the figure depict values from spots charged with relative positive and negative tip bias, respectively. COC was charged with 0.5 s, ±50 V pulses, and all other polymers with ±30 V, 0.5 s pulses. It can be seen that the peak volume, which is proportional to the charge stored at the surface, is strongly increasing for PMMA for negative tip bias in higher humidity, whereas it is strongly decreasing for poly (acrylic acid) for both polarities in higher humidity.

Preferred Embodiments

The new electret materials and the modified method of electret charging described here may be used in all types of electret, i.e. in applications of the first group (e.g. electret microphones, loudspeakers, and electromechanical transducers, electret motors and generators, piezoelectric electret materials, electret air filters for dust particle control, electret ion chambers for measuring ionizing radiation or radon, and polymer electrets for nonlinear optics applications) and applications belonging to the second group (e.g. Xerography, NanoXerography, and data storage) to increase the depth, the strength and the homogeneity of the deposited charge, and to reduce the required charging voltage in corona charging.

For example, water absorbing but insoluble polymers like PMMA and PC are more strongly and more homogeneously corona charged, if a humidity of about 30% RH (relative humidity) is present during charging. Water soluble polymers like e.g. Polyacrylamide (PAAm), can be strongly and deeply charged by corona charging in low ambient humidity with RH<5%.

For applications of the second group where the electrets are recharged and erased during operation, the appropriate amount of humidity has to be present during operation for optimal performance.

Figure 2A:
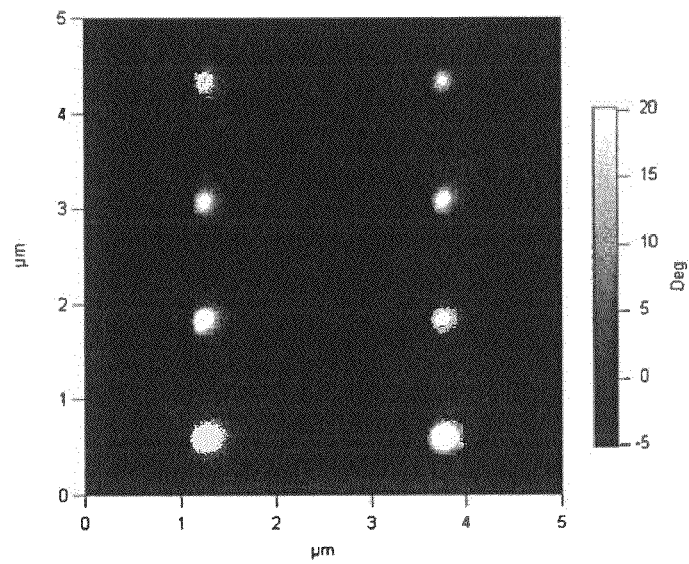
FIG. 2 shows two electric force microscopy phase scans from which the data in FIG. 1 were taken.
Figure 2B:
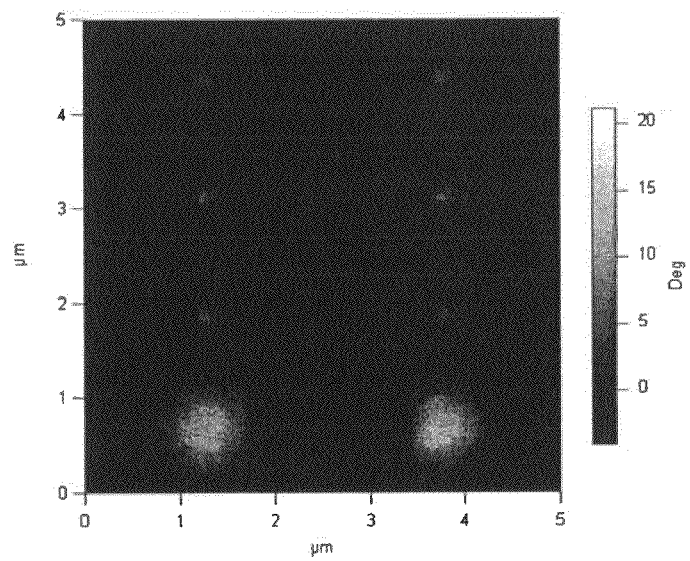
Figure 3:
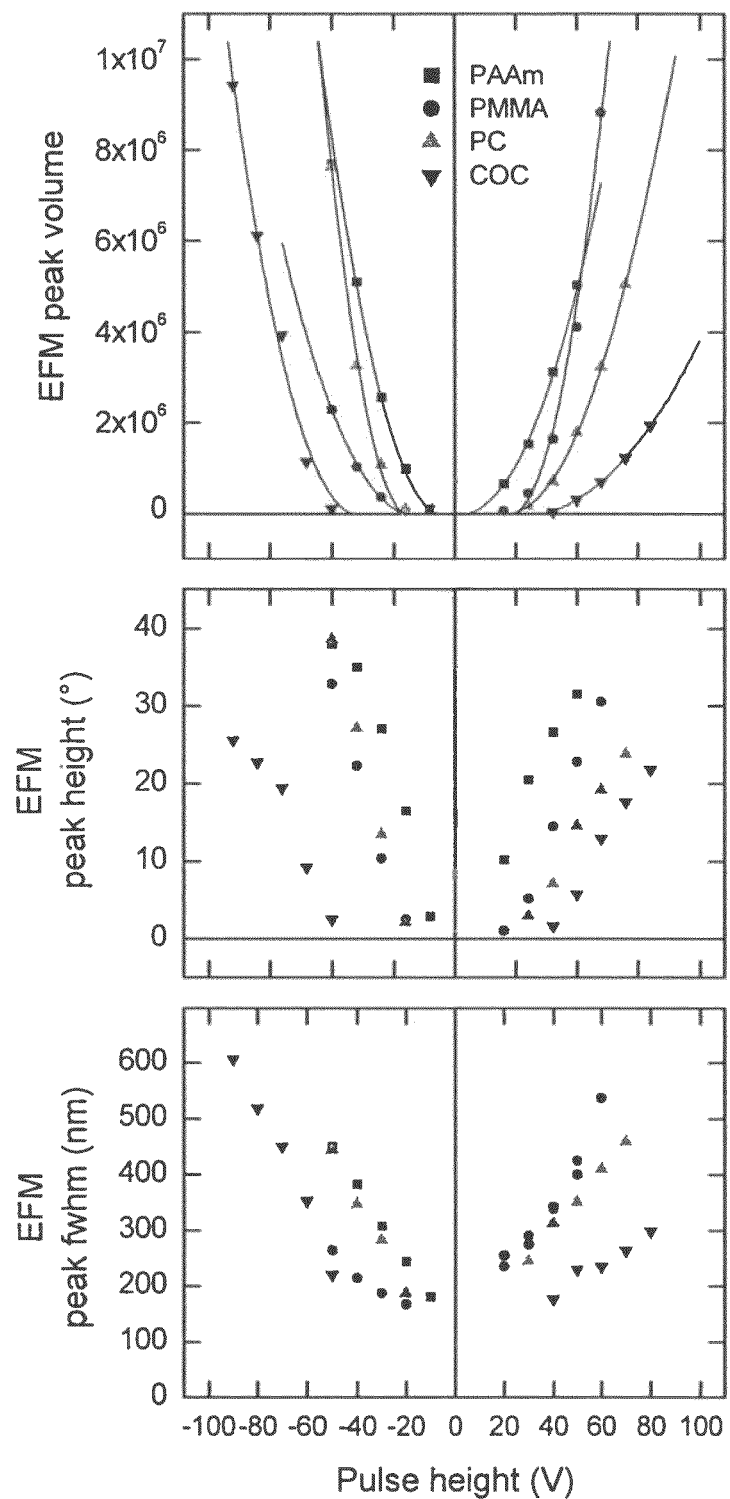
FIG. 3 shows peak height, width and volume of electric force microscopy phase scans of charge spots written in dry atmosphere (<1% RH) by 0.5 s square voltage pulses (20-80 V) for various polymers (COC=cyclic olefin copolymer; PMMA=polymethyl methacrylate, PAAm=polyacrylamide, and PC=polycarbonate)

For example in data storage applications, the humidity also has an effect on the size of stored information, with charge patterns being generally broader when written in higher humidity. This can be seen in the central row in the FIG. 1 showing the full width at half maximum (fwhm) EFM phase signal of charge spots written with a biased probe in different degrees of humidity. For example, charge spots written on COC (A) have a much higher intensity and a reduced width when written in a low humidity smaller than 1% RH. For achieving a high data density, it is therefore beneficial to operate in low humidity. Two EFM phase scans from which the data in FIG. 1. was taken, are shown below (FIG. 2A and FIG. 2B). The charge spots in FIG. 2A were written in low humidity of 1% RH at 25° C., the charge spots in FIG. 2B in 45% RH. The spots were charged by voltage pulses of 50 V applied for 0.5 s, $5*10^{-3}$ s, $5*10^{-5}$ s, and $5*10^{-7}$ s from bottom to top. The spots written in the high humidity are much weaker and broader for longer pulses.

Similarly in Xerography for example, the right amount of humidity reduces the required charging voltage and low humidity increases the resolution of the charge pattern and ultimately of the printed image.

The features of the present invention disclosed in the specification, the claims and/or in the accompanying drawings, may, both separately, and in any combination thereof, be material for realizing the invention in various forms thereof.

The invention claimed is:

1. A method of producing an electret material comprising the steps:
    a) providing a polymeric dielectric material,
    b) electrically charging said polymeric dielectric material, whilst maintaining relative humidity conditions around said material at a relative humidity within a user-defined range, wherein charging occurs by a method selected from (i) heating said polymeric dielectric material to a temperature above the melting temperature or glass transition temperature of said material, subjecting said material to an electric field and cooling said material in the presence of said electric field to a temperature below said melting temperature or glass transition temperature, (ii) corona charging, (iii) subjecting said material to an electron beam or ion beam, (iv) contact electrification, and (v) combinations of any of the foregoing,
    wherein said polymeric dielectric material is a hydrophobic polymer having a water uptake <0.1 wt. %, wherein said relative humidity conditions of step b) are maintained at <5%, or said polymeric dielectric material is a water-insoluble polymer having a water uptake in the range of from 0.1 wt. % to 3 wt. %, wherein said relative humidity conditions of step b) are maintained at a range of from 20% to 40%, or wherein said polymeric dielectric material is a water-soluble or hydrophilic or polyelectrolytic polymer having a water uptake >3wt. %, wherein said relative humidity conditions of step b) are maintained at <5%.

2. The method according to claim 1, wherein said polymeric dielectric material is amorphous.

3. The method according to claim 1, wherein said hydrophobic polymer has a contact angle >100%.

4. The method according to claim 1, wherein said hydrophobic polymer is at least one selected from the group consisting of poly(tetrafluoroethene), fluorinated ethylene-propylene, polyvinylidene fluoride, polystyrene, and cyclic olefin copolymer.

5. The method according to claim 1, wherein said water-insoluble polymer is at least one selected from the group consisting of poly(methyl methacrylate), polycarbonate, polyvinyl chloride, and polyamide.

6. The method according to claim 1, wherein said water-soluble or hydrophilic or polyelectrolytic polymer is at least one selected from the group consisting of poly(acrylamide), poly(acrylic acid), polyethyleneimine, polyvinylamine, poly(ethylene glycol), polyvinyl acetate, poly(2-hydroxyethyl methacrylate), poly (dimethylaminoethyl methacrylate), poly(vinylimidazole), poly(2-methyl-2-oxazoline), poly(2-ethyl-2-oxazoline), poly(N-isopropylacrylamide), and poly (dimethylaminoethyl methacrylate).

7. The method according to claim 6, wherein said relative humidity conditions of step b) are maintained at <1%, and wherein said polymeric dielectric material is dried prior to performing step b).

8. The method according to claim 1, wherein said polymeric dielectric material is prepared as a film.

9. The method according to claim 1, wherein said polymeric dielectric material, after performing step b), is maintained under the same relative humidity conditions as in step b) and using said polymeric dielectric material at the same relative humidity conditions as in step b).

10. The method according to claim 1, wherein charging occurs by corona charging using a plane electrode on one side of said polymeric dielectric material and at least one pointed electrode or an elongated electrode or a wire-shaped electrode, on another side of said polymeric dielectric material which said pointed or elongated or wire-shaped electrode is at a potential of 1 V to 100 kV, with respect to said plane electrode, and, optionally, a grid-shaped electrode between said polymeric dielectric material and said pointed or elongated or wire-shaped electrode.

11. The method according to claim 10, wherein said pointed or elongated or wire-shaped electrode is in contact with said polymeric dielectric material and said grid-shaped electrode is absent.

12. An electret material being made of a water-soluble or hydrophilic or polyelectrolytic polymer produced by the method according to claim 1.

13. The electret material according to claim 12, wherein said polymer is at least one selected from the group consisting of polyacrylamide, poly(acrylic acid), polyethylenimine, polyvinylamine, poly(ethylene glycol), polyvinylacetate, poly(2-hydroxyethyl methacrylate), poly (dimethylaminoethyl methacrylate), poly(vinylimidazole), poly(2-methyl-2-oxazoline), poly(2-ethyl-2-oxazoline), poly(N-isopropylacrylamide), and poly(dimethylaminoethyl methacrylate).

14. The electret material according to claim 12, having a water content <0.1 wt. % prior to performing step b).

15. A device comprising the electret material according to claim 12.

16. The device according to claim 15, which is an electronic device.

17. The device according to claim 15, being selected from microphones, mobile phones, loudspeakers, electromechanical transducers, piezoelectric electrets, electret motors and generators, electret air filters for dusk particle control, electret ion chambers for detecting ionizing radiation or radon, devices comprising nonlinear optics or nanofluidics, electret field effect transistors for data storage, laser printers and xerographic devices.

18. The method according to claim 1, wherein the hydrophobic polymer is at least one selected from the group consisting of poly(tetrafluoroethene), poly(methylmethacrylate) and polyacrylamide.

19. The method according to claim 1, wherein the polymeric dielectric material is a hydrophobic polymer having a water uptake of less than 0.1 wt. %, wherein said relative humidity conditions of step b) are maintained at less than 1% relative humidity, or wherein said polymeric dielectric material is a water-soluble or hydrophilic or polyelectrolytic polymer having a water uptake of greater than 3 wt. %, wherein said relative humidity conditions of step b) are maintained at less than 1% relative humidity.

20. The method according to claim 7, wherein the polymeric dielectric material is dried by heating in vacuum or dry controlled atmosphere or by storage under dry conditions for a sufficient time to dehydrate the polymeric dielectric material to a water content of less than 0.1 wt. %.

21. The method according to claim 8, wherein the polymeric dielectric material is prepared as a thin film cast from aqueous solution.

22. The method according to claim 9, wherein the polymeric dielectric material, after performing step b), is maintained under the same relative humidity conditions as in step b) by sealing or coating or storing the polymeric dielectric material.

23. The method according to claim 10, wherein the pointed or elongated or wire-shaped electrode is at a potential of from 1 V to less than 1 kV.

24. The method according to claim 10, wherein the pointed or elongated or wire-shaped electrode is at a potential of from 1 V to 0.5 kV.

25. The method according to claim 10, wherein the pointed or elongated or wire-shaped electrode is at a potential of from 1 V to 100V.

26. The device according to claim 15, in the form of at least one of a foil for wound and fractured bone healing and a bandage for wound and fractured bone healing.

27. The method according to claim 1, wherein said polymeric dielectric material is a hydrophobic polymer having a water uptake <0.1 wt. %, wherein said relative humidity conditions of step b) are maintained at <5%.

28. The method according to claim 1, wherein said polymeric dielectric material is a water-insoluble polymer having a water uptake in the range of from 0.1 wt. % to 3 wt. %, wherein said relative humidity conditions of step b) are maintained at a range of from 20% to 40%.

29. The method according to claim 1, wherein said polymeric dielectric material is a water-soluble or hydrophilic or polyelectrolytic polymer having a water uptake >3 wt. %, wherein said relative humidity conditions of step b) are maintained at <5%.

* * * * *